(12) United States Patent
Walkup

(10) Patent No.: US 6,519,155 B1
(45) Date of Patent: Feb. 11, 2003

(54) RETAINER DEVICE FOR HEAT SINK ASSEMBLY

(75) Inventor: William B. Walkup, Hillsboro, OR (US)

(73) Assignee: Hon Hai Precision Ind. Co., Ltd., Taipei Hsieh (TW)

( * ) Notice: Subject to any disclaimer, the term of this patent is extended or adjusted under 35 U.S.C. 154(b) by 0 days.

(21) Appl. No.: 09/962,719

(22) Filed: Sep. 24, 2001

(51) Int. Cl.[7] ................................................. H05K 7/20

(52) U.S. Cl. ....................... 361/704; 165/80.3; 257/719; 257/722; 257/727; 24/458; 248/510; 361/719

(58) Field of Search .................. 24/295–296, 457–458; 165/80.2, 80.3, 185; 174/16.3; 257/706–707, 712–713, 718–719, 722, 726–727; 361/704, 707, 709–710, 715, 717–720; 248/505, 510

(56) References Cited

U.S. PATENT DOCUMENTS

| | | | | |
|---|---|---|---|---|
| 5,664,624 A | * | 9/1997 | Tsai ............................ | 165/80.3 |
| 5,828,550 A | * | 10/1998 | Horng ......................... | 361/697 |
| 6,343,017 B1 | * | 1/2002 | Yu et al. ...................... | 361/704 |
| 6,360,812 B1 | * | 3/2002 | Lo .............................. | 165/80.3 |
| 6,362,963 B1 | * | 3/2002 | Lee et al. .................... | 361/704 |

* cited by examiner

Primary Examiner—Gregory Thompson
(74) Attorney, Agent, or Firm—Wei Te Chung (57) ABSTRACT

A retainer device (1) for attaching a heat sink (30) to a CPU (40) includes a retention module (10) and a slider (20). The retention module has a non-symmetrical opening (12) in a side wall (14) thereof, thus defining a slanted surface (16) on the retention module. The slider defines a first slot (23) accommodating a flange (38) of the heat sink and the side wall of the retention module, and a second ramp slot (25) opposite to the first slot for accommodating the slanted surface of the retention module. A locking spring (27) is connected to the slider with a rotatable cam. The locking spring has a cantilever beam (28), and a pressing portion (29) pressing against the flange of the heat sink.

21 Claims, 8 Drawing Sheets

RETAINER DEVICE FOR HEAT SINK ASSEMBLY

BACKGROUND OF THE INVENTION

1. Field of the Invention

The present invention relates to a retainer device for a heat sink assembly, and particularly to a retainer device incorporating a slider to lock the heat sink in position.

2. Related Art

Developments in integrated circuits have resulted in greater circuit density and complexity, thus increasing the heat generated by operation of such integrated circuits within an electronic package. Therefore, bigger and heavier heat sinks are becoming increasingly necessary to more efficiently remove the heat. Accordingly, the force required to keep a heat sink in place has also increased. The heat sink is commonly kept in place with screws or strong springs.

Screwdrivers or other tools are often required for installation or removal of the screws or of stiff springs. Computer builders worry greatly when people who maintain computers handle such tools near delicate components such as a PCB. Moreover, a very wide tolerance is often stacked up in the CPU/connector/heat sink assembly, which makes the installation less precise.

Thus a retainer device capable of safely and conveniently securing a heavy heat sink is desired.

BRIEF SUMMARY OF THE INVENTION

Accordingly, an object of the present invention is to provide a retainer device which readily and securely attaches a heat sink to a CPU.

Another object of the present invention is to provide a retainer device which compactly attaches a heat sink to a CPU and eliminates tolerance stack-up during assembly.

A further object of the present invention is to provide a retainer device which does not require tools for assembly or disassembly.

A still further object of the present invention is provide a retainer device which provides a good grounding path for a heat sink.

To achieve the above-mentioned objects, a retainer device for attaching a heat sink to a CPU comprises a pair of retention modules and a pair of sliders. Each retention module has a non-symmetrical opening defined in a side wall thereof, thus defining a slanted surface on the retention module. Each slider defines a first slot accommodating a flange of the heat sink and the side wall of the retention module, and a second ramp slot opposite to the first slot for accommodating the slanted surface of the retention module. A locking spring is connected to the slider with a rotatable cam. The locking spring has a cantilever beam, and a pressing portion pressing against the flange of the heat sink.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
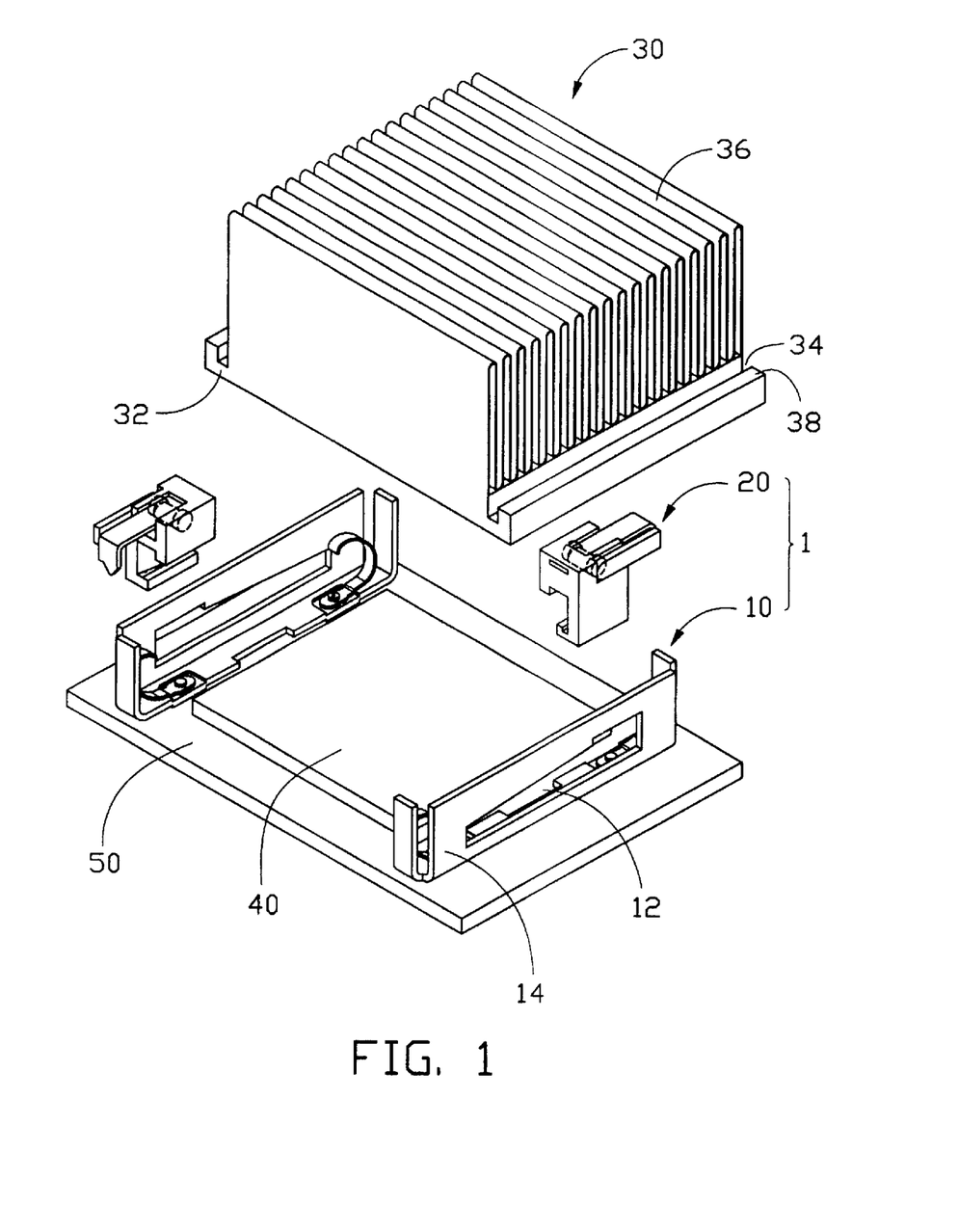
FIG. 1 is an exploded view of a pair of retainer devices in accordance with a preferred embodiment of the present invention, together with a heat sink, a CPU and a mother board.

FIG. 1 shows a pair of retainer devices I in accordance with a preferred embodiment of the present invention, together with a heat sink 30, a CPU 40 and a mother board 50. Each retainer device 1 includes a retention module 10 and a slider 20. The retention modules 10 are made of stainless steel, and are mounted to the mother board 50 with screws (not labeled). The CPU 40 is mounted to the mother board 50, and accommodated between the pair of retention modules 10.

The heat sink 30 has a base 32 defining a pair of grooves 34 spaced from each other, and a plurality of fins 36 extending upwardly from a top surface of the base 32 between the grooves 34. The base 32 has a pair of flanges 38 spaced from each other, each flange 38 being adjacent an outer extremity of the corresponding groove 34.

Each retention module 10 defines a stamped non-symmetrical opening 12 in a side wall 14 thereof. The opening 12 is rectangular at one end, steps down and finally tapers uniformly to an opposite end, thus defining a slanted surface 16 (see FIG. 4).

Figure 2A:
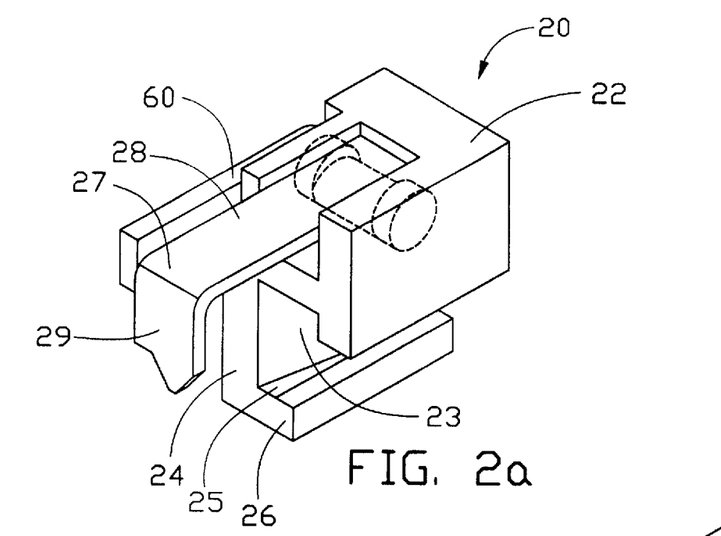
FIG. 2a is a perspective view of a slider of one retainer device of FIG. 1.
Figure 2B:
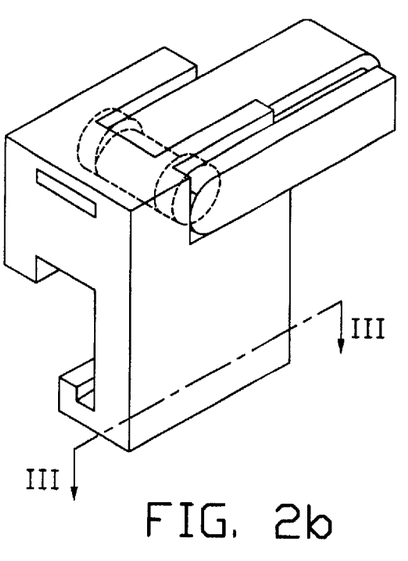
FIG. 2b is a perspective view of the slider shown in FIG. 2a, but viewed from another direction.
Figure 3:
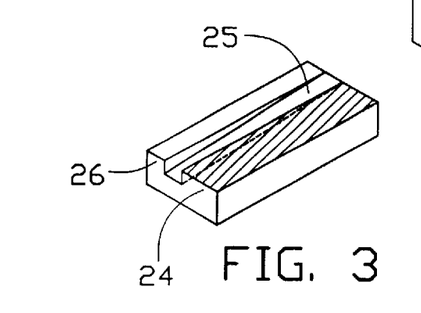
FIG. 3 is a cross-sectional view of FIG. 2b, taken along line III—III.

Referring also to FIGS. 2a and 2b, the slider 20 has a head 22, a side plate 24 depending from the head 22 and a lower portion 26 extending horizontally from a bottom section of the side plate 24. A first slot 23 is defined in a bottom surface of the head 22. A second ramp slot 25 is defined in a top surface of the lower portion 26, opposite to the first slot 23 of the head 22. The second ramp slot 25 is a molded ramp slot (see FIG. 3), for cooperating with the slanted surface 16 of the retention module 10.

A locking spring, 27 is disposed on the head 22. The locking spring 27 comprises a cantilever beam 28, and a pressing portion 29 depending from a free end of the cantilever beam 28. The pressing portion 29 comprises a steel pointed nose (not labeled). An operation beam 60 is disposed beside the cantilever beam 28. An end of the operation beam 60 is connected with an end of the locking spring 27 by a rotatable cam (shown in dashed lines) which is inside the head 22. When the operation beam 60 is upright, the locking spring 27 in a relaxed position.

Figure 4:
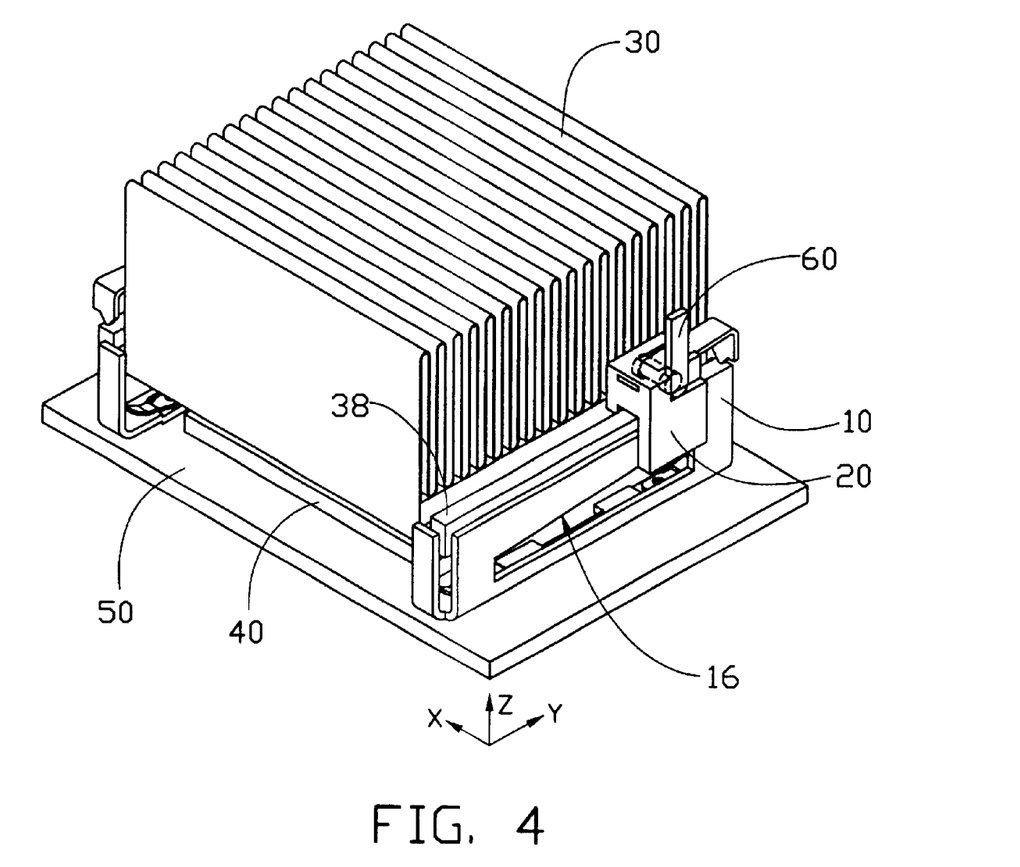
FIGS. 4–6 are progressive assembled views of FIG. 1, showing the slider in various stages of positioning.
Figure 5:
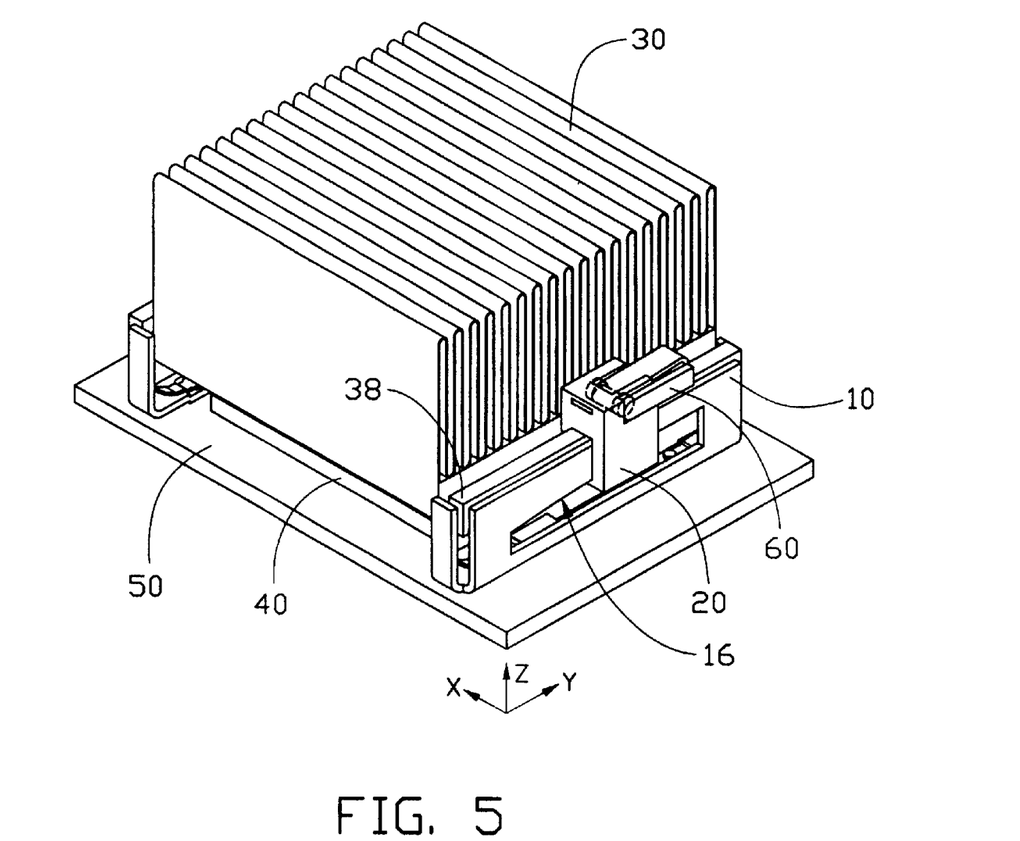
Figure 6:
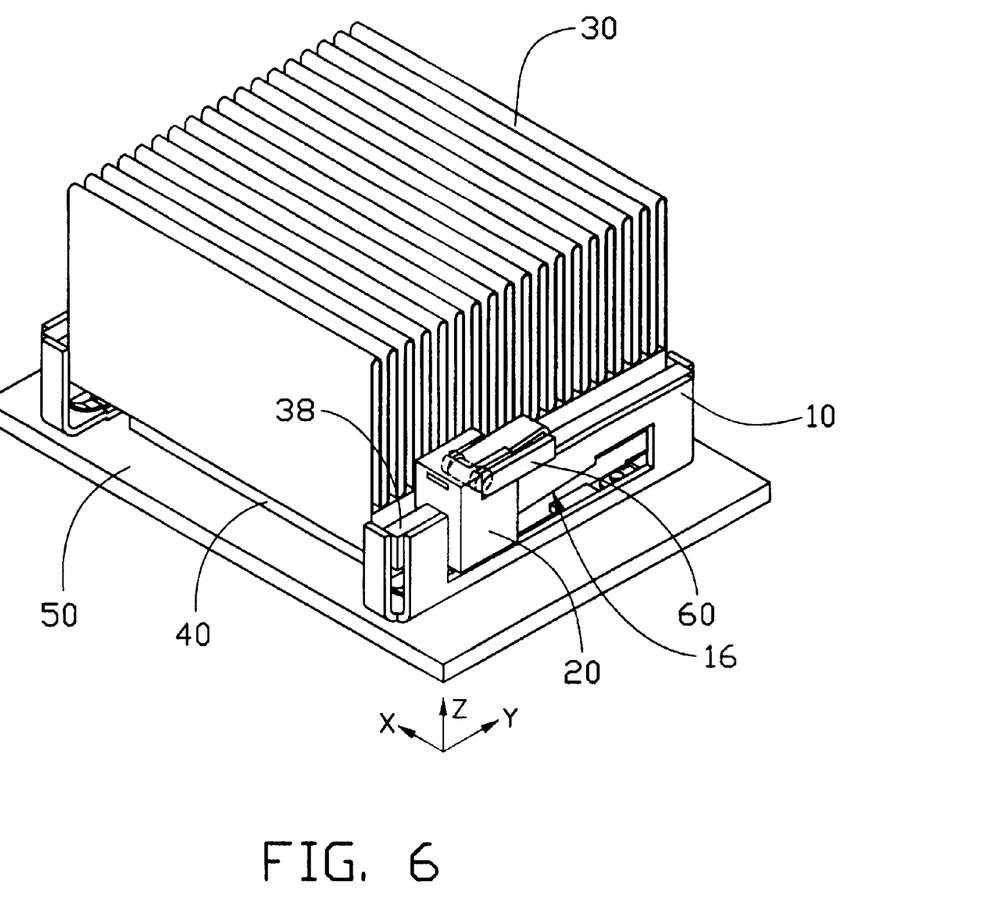

Referring to FIGS. 4–6, in assembly, the heat sink 30 is attached to a top surface of the CPU 40. The retention modules 10 support, position and lock in the heat sink 30. The heat sink 30 cannot move in the "x" or "y" directions, and can only move in the "z" direction. This ensures that the heat sink 30 is not displaced when subjected to vibration or shock during normal operation. The first slot 23 of each slider 20 accommodates the corresponding flange 38 of the heat sink 30. The lower portion 26 of each slider 20 extends through the rectangular portion of the opening 12 of the corresponding retention module 10. The operation beam 60 of each slider 20 stands upright in a relaxed position.

The slider 20 is moved to a beginning portion of the slanted surface 16 of the retention module 10. The operation beam 60 is pressed down to a horizontal position. This lifts the cam which in turn lifts the cantilever beam 28, so that the pressing portion 29 strongly presses against a top surface of the flange 38 of the heat sink 30 in a locked position (see FIG. 5). The slider 20 is then moved away from the rectangular opening along the slanted surface 16, until the slider 20 at the first slot 23 firmly abuts against the flange 38 of the heat sink 30. This eliminates stacked-up tolerance in the assembly process. The pointed nose (not labeled) of the pressing portion 29 contacts the flange 38 at a side of the slider 20 nearest the rectangular opening. Thus the pointed nose (not labeled) prevents the slider 20 from moving back toward the rectangular opening (see FIG. 6).

Figure 7:
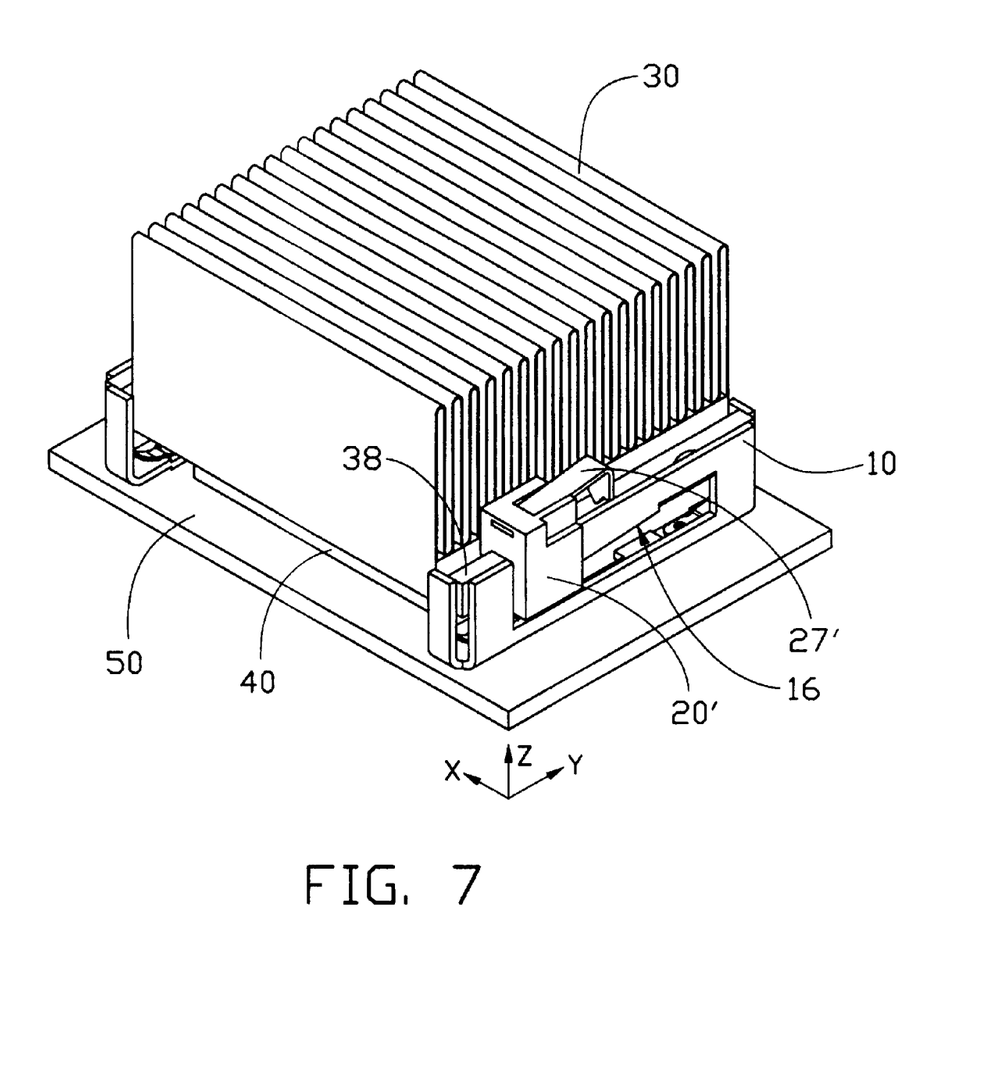
FIG. 7 is similar to FIG. 6, but showing an alternative embodiment of the present invention.

FIG. 7 shows a slider 20' in accordance with an alternative embodiment of the present invention. The slider 20' comprises a simple locking spring 27', without the operation beam 60 shown in FIG. 2. The locking spring 27' has force bearing on the flange 38 of the heat sink 30. A force of about one pound per square inch has been found to be suitable. The slider 20' is simple to manufacture and operate.

Figure 8:
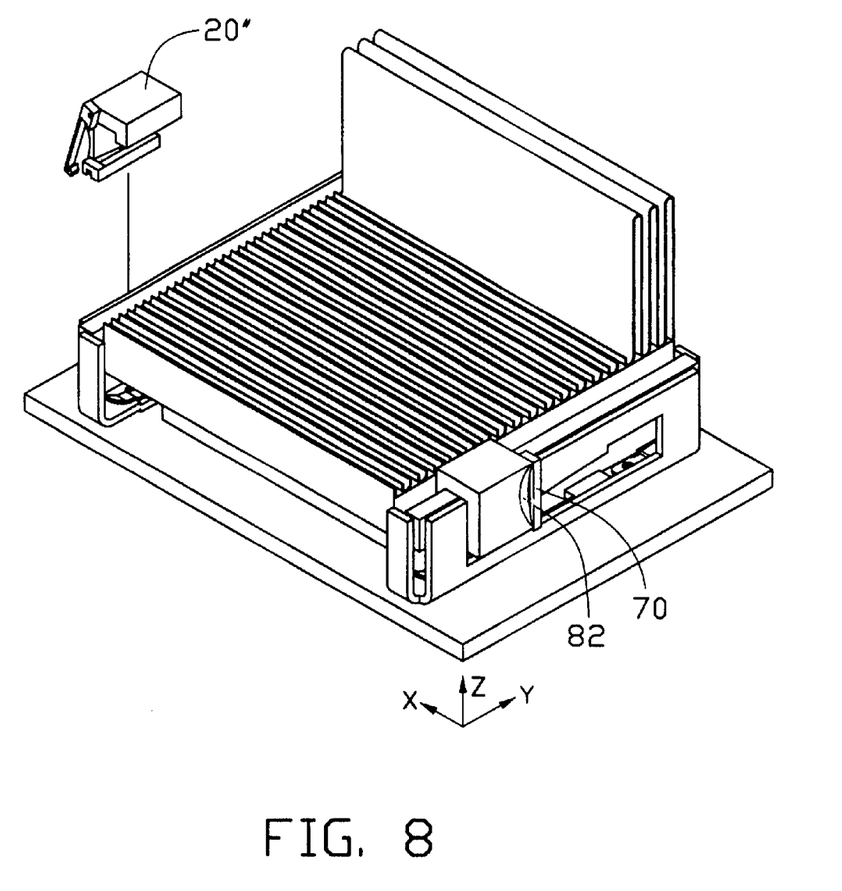
FIG. 8 is similar to FIG. 6, but showing a further alternative embodiment of the present invention.
Figure 9:
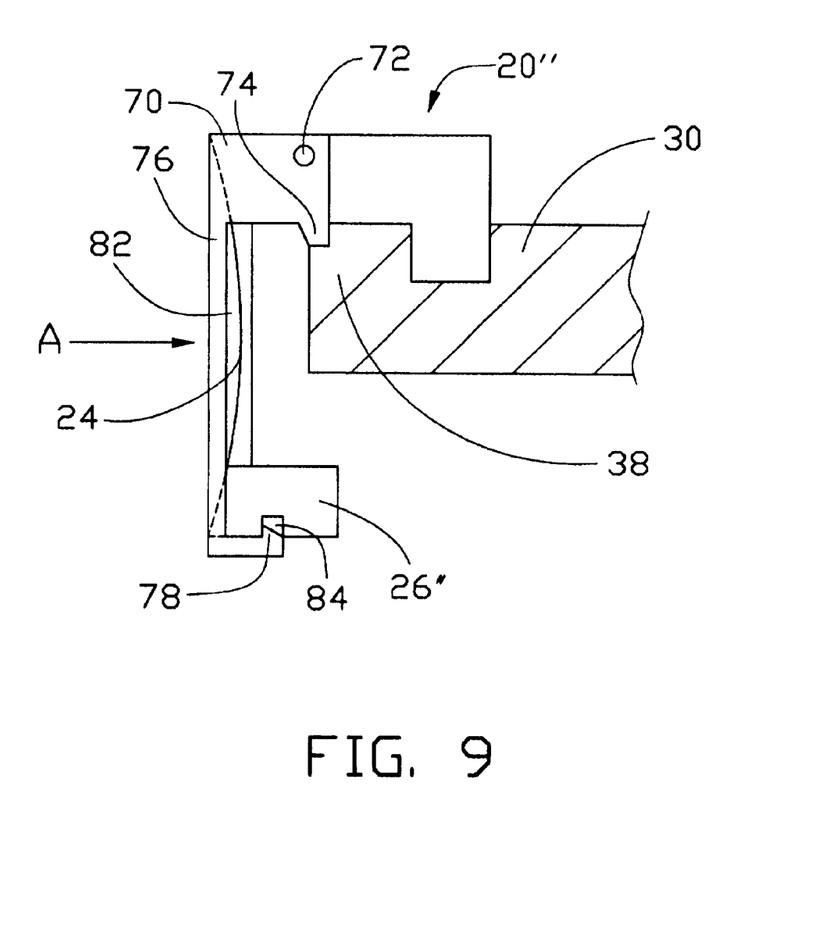
FIG. 9 is a partial cross-sectional view showing a slider of FIG. 8 in a locked position.

FIGS. 8 and 9 show a slider 20" in accordance with a further alternative embodiment of the present invention. In FIG. 8, part of the heat sink 30 has been cut away to show one of the sliders 20" detached from the assembly. This better illustrates the structure of the slider 20'. A latch 70 is mounted to the one end of the slider 20" with a dowel 72, such that the latch 70 can pivot about the dowel 72. A lock tooth 74 depends from a non-free end of the latching device 70. The latch 70 has an L-shaped leg 76 depending therefrom, and a hook 78 at a free end of the leg 76. The slider 20" has a concave surface 82 formed at a portion of an outer surface of the side plate 24 of the slider 20" nearest the latch 70. The lower portion 26" is longer than an upper portion of the slider 20", such that an end of the lower portion 26" protrudes beyond the upper portion at the latch 70. A cutout 84 is defined in a bottom surface of part of the lower portion 26" nearest the latch 70.

The slider 20" is slid to a proper position in which the slider 20" is secured to the retention module 10. The latch 70 is rotated downwardly and inwardly, until the lock tooth 74 digs into the flange 38 of the heat sink 30. The hook 78 engages in the cutout 84 of the slider 20", thereby holding the latch 70 in position. In disassembly, the latch 70 is pressed inwardly in direction A, as shown in FIG. 9. The concave surface 82 allows the latch 70 to be easily pressed with an operator's finger. The leg 76 is thereby bent, which causes the hook 78 to disengage away from the groove 84. The latch 70 is then rotated away from the locked position, and the tooth 74 is withdrawn from the flange 38.

In the above-mentioned embodiments, the stainless steel retention modules 10 are mounted to the mother board 50 with screws (not labeled). A pair of curved spring strips (not labeled) is attached to each retention module 10 by the screws. A free end of each strip touches a bottom surface of the base 32 of the heat sink 30. Thus electrostatic buildup in the heat sink assembly is easily dissipated to suitable grounding portions on the mother board 50.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A retainer device for fastening a heat sink to a CPU, comprising:

at least one retention module having an opening defining a slanted surface thereon;

at least one slider slidable along the at least one retention module adapted for attaching the heat sink to the CPU, the at least one slider having a ramp slot cooperating with and slidable along the slanted surface of the at least one retention module; and at least one locking device attached to the at least one slider for holding the at least one slider in position.

2. The retention device as described in claim 1, wherein the opening of the at least one retention module is non-symmetrical, has one rectangular end, and tapers uniformly to an opposite end thereby defining the slanted surface.

3. The retention device as described in claim 1, wherein at least one slider comprises a head, a side plate depending from the head, and a lower portion extending generally horizontally from a bottom portion of the side plate.

4. The retention device as described in claim 3, wherein a first slot is defined in a bottom surface of the head of the at least one slider, for accommodating a flange of the heat sink and a side wall of the at least one retention module.

5. The retention device as described in claim 4, wherein the ramp slot is defined in a top surface of the lower portion of the at least one slider, opposite to the first slot, for accommodating the slanted surface of the at least one retention module.

6. The retention device as described in claim 1, wherein the at least one locking device comprises a locking spring disposed on a head of the at least one slider, the locking spring having a cantilever beam and a pressing portion depending from the cantilever beam for applying force on a flange of the heat sink.

7. The retention device as described in claim 6, wherein the locking spring further comprises an operation beam, one end of the operation beam being connected with one end of the locking spring by a rotatable cam.

8. The retention device as described in claim 1, wherein the at least one locking device is a latch which is mounted to the at least one slider with a dowel, the latch being rotatable around the dowel, and the latch having a leg.

9. The retention device as described in claim 8, wherein a tooth is formed on one non-free end of the latch, for digging into a flange of the heat sink.

10. The retention device as described in claim 8, wherein a hook is formed at a free end of the leg, for engaging with a cutout defined in a bottom surface of the at least one slider.

11. The retention device as described in claim 8, wherein a concave surface is formed in a side plate of the at least one slider, for facilitating pushing of the latch of the at least one locking device during disassembly.

12. A heat sink assembly comprising:

a heat sink having a base defining at least one groove; and a retainer device comprising at least one retention module attached to a mother board and at least one slider slidable along the at least one retention module and the at least one groove of the heat sink for attaching the heat sink to a CPU, the at least one retention module defining an opening forming a slanted surface thereon, the at least one slider defining a ramp slot for cooperating with the slanted surface of the at least one retention module, a locking device being resiliently attached to the at least one slider and pressing against the heat sink.

13. The heat sink assembly as described in claim 12, wherein the heat sink forms at least one flange adjacent the at least one groove, the at least one flange being accommodated within an upper slot of the at least one slider.

14. The heat sink assembly as described in claim 13, wherein the locking device is resiliently attached to the at least one slider and presses against the at least one flange of the heat sink, for preventing the at least one slider from sliding away from a locked position.

15. The heat sink assembly as described in claim 13, wherein the locking device can rotate about one point of the at least one slider and engage with the at least one flange of the heat sink, thereby positioning the at least one slider relative to the heat sink.

16. An electrical device, comprising:

a printed circuit board;

an electronic package mounted on the printed circuit board;

at least one retention module mounted on the printed circuit board and located near the electronic package, the at least one retention module defining an opening forming a slanted surface thereon;

a heat sink mounted on the electronic package, the heat sink comprising a base, a plurality of fins projecting upwardly from base and at least one flange projecting upwardly from the base and located between the fins and the at least one retention module; and at least one slider slidably mounted on the at least one retention module along a first direction, defining a ramp slot cooperating with the slanted surface of the at least one retention module and having a locking device pivotably mounted thereon, said locking device pressing against the at least one flange of the heat sink thereby fixing the heat sink to the electronic package and the at least one slider to the at least one retention module.

17. The electronic assembly as described in claim 16, wherein the locking device is pivotable about an axis which is perpendicular to the first direction.

18. The electronic assembly as described in claim 16, wherein the locking device is pivotable about an axis which is parallel to the first direction.

19. The electronic assembly as described in claim 17, wherein the locking device comprises a cam mechanism and a locking spring drivably connected with the cam mechanism.

20. The electronic assembly as described in claim 18, wherein the locking device has a hook at a lower end thereof, said hook engaging in a cutout defined in a bottom of the at least one slider.

21. A heat sink assembly comprising:

a printed circuit board;

a CPU located on the printed circuit board;

a heat sink seated upon the CPU;

a retention module secured on the printed circuit board beside said CPU;

a slider guidably, slidably and engagably moved relative to the retention module along a horizontal longitudinal direction of said retention module; and a locking device attached to and moved along with said slider; wherein when said slider is located around one end of said retention module, said locking device is essentially free from said heat sink with providing no vertical pressure against the heat sink; when said slider is located around the other end of the retention module, said locking device downwardly urges and presses against the heat sink toward the printed circuit board.

* * * * *